United States Patent
Shimizu et al.

(10) Patent No.: US 9,991,916 B2
(45) Date of Patent: Jun. 5, 2018

(54) RECEIVING DEVICE AND RECEIVING METHOD

(71) Applicant: Sony Corporation, Tokyo (JP)

(72) Inventors: Hiroyuki Shimizu, Saitama (JP); Tomonori Nakajima, Tokyo (JP); Toshikazu Yoshida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days. days.

(21) Appl. No.: 14/774,849

(22) PCT Filed: Jan. 7, 2014

(86) PCT No.: PCT/JP2014/000017
§ 371 (c)(1),
(2) Date: Sep. 11, 2015

(87) PCT Pub. No.: WO2014/147921
PCT Pub. Date: Sep. 25, 2014

(65) Prior Publication Data
US 2016/0028422 A1    Jan. 28, 2016

(30) Foreign Application Priority Data

Mar. 18, 2013  (JP) ................................ 2013-054938

(51) Int. Cl.
*H04L 27/08* (2006.01)
*H04B 1/10* (2006.01)
(Continued)

(52) U.S. Cl.
CPC ............... *H04B 1/10* (2013.01); *H03J 1/005* (2013.01); *H04B 1/1027* (2013.01); *H04N 5/44* (2013.01);
(Continued)

(58) Field of Classification Search
CPC ..... H03L 7/099; H03C 3/0991; H03F 1/0211; H04B 15/02; H04B 1/10; H04N 5/44
(Continued)

(56) References Cited

U.S. PATENT DOCUMENTS 6,766,157 B1 * 7/2004 Hunzeker ............. H03D 3/008
455/316
7,263,340 B2 * 8/2007 Uozumi ................... H03L 1/02
331/176

(Continued)

FOREIGN PATENT DOCUMENTS

| JP | 08-255117 A | 10/1996 |
| JP | 2003-309776 A | 10/2003 |
| WO | WO 2007/099621 A1 | 9/2007 |

*Primary Examiner* — Leila Malek
(74) *Attorney, Agent, or Firm* — Wolf, Greenfield & Sacks, P.C.

(57) ABSTRACT

At least one distributor that distributes a high-frequency signal received by an antenna; and a high-frequency processing unit that outputs a received signal obtained by mixing the high-frequency signal distributed by the distributor with a local oscillator frequency generated by a local oscillator that includes a voltage-controlled oscillator are included. Furthermore, a control unit that, when executing a local oscillator frequency search to investigate a correspondence between a control voltage applied to the voltage-controlled oscillator and the local oscillator frequency of the voltage-controlled oscillator, sets to a dormant state parts constituting the local oscillator that are uninvolved in operation of the local oscillator frequency search is included.

5 Claims, 10 Drawing Sheets

(51) Int. Cl.
  *H04N 5/44* (2011.01)
  *H03J 1/00* (2006.01)
  *H04N 5/50* (2006.01)
  *H04N 5/455* (2006.01)

(52) U.S. Cl.
  CPC ............ *H04N 5/50* (2013.01); *H03J 2200/10* (2013.01); *H04N 5/455* (2013.01)

(58) Field of Classification Search
  USPC .................................................. 375/345, 346
  See application file for complete search history.

(56) References Cited

U.S. PATENT DOCUMENTS

| | | | |
|---|---|---|---|
| 2003/0009772 A1* | 1/2003 | Karr ........................ | H04B 1/10 725/142 |
| 2003/0099456 A1* | 5/2003 | Ohmura ............... | G11B 19/025 386/216 |
| 2012/0326795 A1* | 12/2012 | Chiu ....................... | H03L 7/099 331/17 |

* cited by examiner

RECEIVING DEVICE AND RECEIVING METHOD

TECHNICAL FIELD

The present disclosure relates to a receive device that receives a broadcast wave and a receiving method conducted by the receiving device, and more particularly, to technology for receiving multiple broadcast waves.

BACKGROUND ART

Recently, the number of channels on digital terrestrial television broadcasting and satellite broadcasting is increasing, and there are increasing needs for functions enabling a user to view one program while also simultaneously viewing another program being broadcast at the same time, and to simultaneously record two or more different programs being broadcast at the same time. Realizing such functions requires the provision of multiple subsystems of tuner units that select and demodulate a broadcast wave in a receiving device that receives broadcast waves. A broadcast signal received by an antenna and split by a splitter is supplied to these multiple subsystems of tuner units. For example, Patent Literature 1 describes a tuner device configured to split a broadcast signal received by an antenna with a splitter and supply the split broadcast signal to tuner units in respective subsystems, thereby enabling parallel reception of two or more broadcast waves from different broadcast systems.

CITATION LIST

Patent Literature

Patent Literature 1: JP 2003-309776A

SUMMARY OF INVENTION

Technical Problem

In a receiving device including multiple subsystems of tuner units in this way, noise may run through the picture during demodulation, such as when one tuner unit is demodulating a broadcast wave on a designated channel, and meanwhile another tuner unit changes channel. This phenomenon occurs at the timing when multiple different tuner units receive a broadcast wave on the same frequency as a result of a channel selection operation being conducted. The local oscillator frequencies generated by a local oscillator in each tuner unit interfere with each other, thereby degrading the reception of the tuner unit that is currently receiving a broadcast wave.

Such a phenomenon may even occur outside of channel selection, and for example, may occur when performing calibration (optimization) of a voltage-controlled oscillator (VCO) inside a tuner unit. VCO calibration refers to the operation of driving the VCO in a real operating environment and investigating the correspondence between the oscillator frequency and the control voltage at that time, and is generally conducted when the tuner unit starts up, during channel selection, or the like.

A variable capacitance element is almost always used as the frequency selecting element that changes the oscillator frequency of the VCO, and the properties of a variable capacitance element change depending on factors such as the temperature, humidity, and power source voltage at the time of use. For this reason, by conducting VCO optimization such as when the tuner unit starts up or during channel selection, the control voltage for obtaining the desired reception frequency at that time may be ascertained accurately.

However, in order to investigate the correspondence between the oscillator frequency and the control voltage when performing VCO calibration, oscillation is actually generated with an oscillator. Consequently, the local oscillator frequency as well as corresponding harmonic and subharmonic oscillations leak into other tuner units currently receiving a broadcast wave, and this appears as noise in the picture being received. In other words, performing VCO calibration degrades the reception of other tuner units currently receiving a broadcast wave.

The present disclosure was devised in light of such issues, and an objective thereof is to decrease, in a receiving device equipped with multiple subsystems of tuner units, noise appearing in a picture being received by another tuner unit when optimizing a voltage-controlled oscillator.

Solution to Problem

To solve the above problem, a receiving device of the present disclosure is equipped with at least one frequency divider, a high-frequency processing unit, and a control unit, and the configuration and function of each unit are as follows. The distributor distributes a high-frequency signal received by an antenna. The high-frequency processing unit outputs a received signal obtained by mixing the high-frequency signal distributed by the distributor with a local oscillator frequency generated by a local oscillator that includes a voltage-controlled oscillator. The control unit executes a local oscillator frequency search to investigate a correspondence between a control voltage applied to the voltage-controlled oscillator and the local oscillator frequency of the voltage-controlled oscillator, and when executing the local oscillator frequency search, sets to a dormant state parts constituting the local oscillator that are uninvolved in operation of the local oscillator frequency search.

To solve the above problem, steps of a receiving method of the present disclosure are as follows. First, a high-frequency signal received by an antenna is distributed. Then, a received signal obtained by mixing the distributed high-frequency signal with a local oscillator frequency generated by a local oscillator that includes a voltage-controlled oscillator is output. Then, when executing a local oscillator frequency search to investigate a correspondence between a control voltage applied to the voltage-controlled oscillator and the local oscillator frequency of the voltage-controlled oscillator, parts constituting the local oscillator that are uninvolved in operation of the local oscillator frequency search are set to a dormant state.

By configuring the receiving device and conducting a process in this way, the amount of signal leaking into another tuner unit when executing a local oscillator frequency search is reduced.

Advantageous Effects of Invention

According to a receiving device and a receiving method of the present disclosure, in a receiving device equipped with multiple subsystems of tuner units, the amount of signal leaking into another tuner unit when executing a local oscillator frequency search is reduced. Consequently, when executing a local oscillator frequency search, it is possible to reduce noise appearing in a picture being received by another tuner unit.

DESCRIPTION OF EMBODIMENTS

An example of a receiving device according to an embodiment of the present disclosure will be described in the following order with reference to the drawings. However, the present disclosure is not limited to the following example.

1. First embodiment (example of speeding up internal clock during local oscillator frequency search)
   1-1. Configuration of receiving device
   1-2. Receiving method conducted by receiving device
2. Second embodiment (example of setting blocks not involved in operation of local oscillator frequency search to a dormant state during local oscillator frequency search)
3. Various modifications

1. First Embodiment

[1-1. Exemplary Configuration of Receiving Device]
(1-1-1. Exemplary Overall Configuration of Receiving Device)

Figure 1:
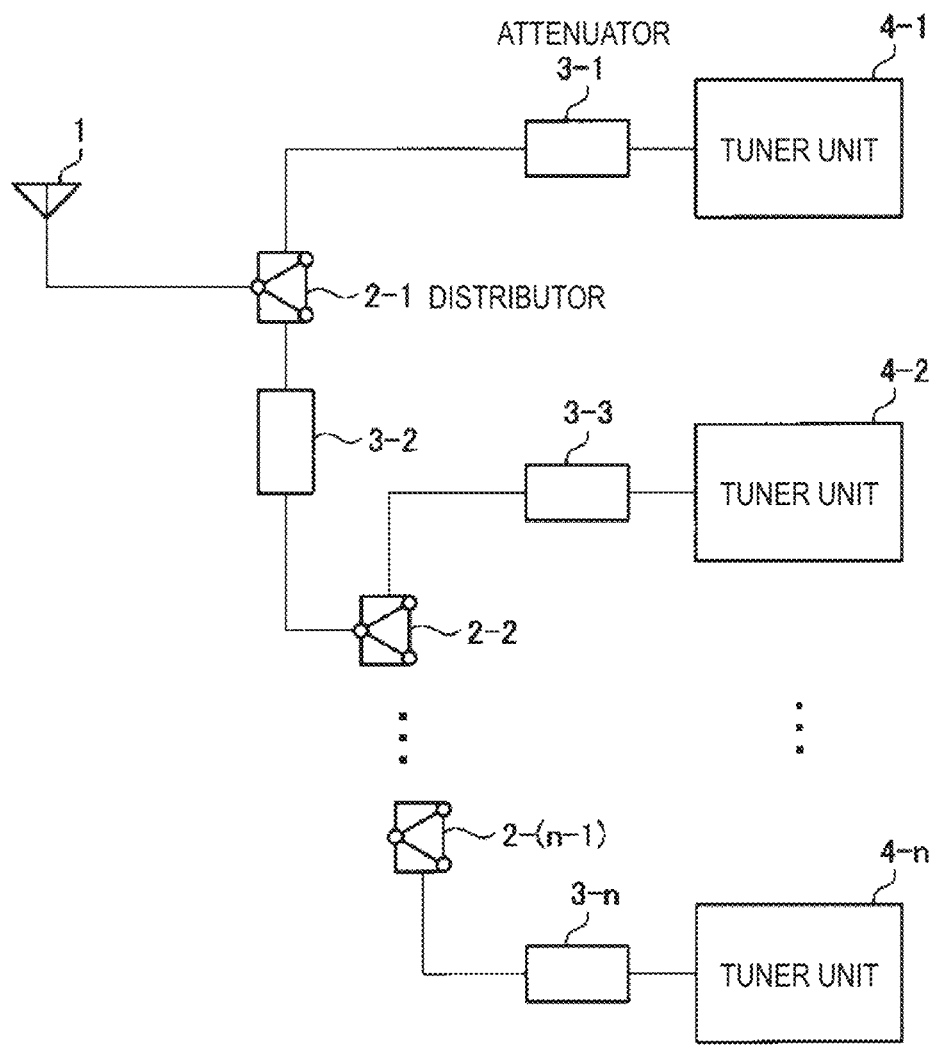
FIG. 1 is a block diagram illustrating an exemplary configuration of a receiving device according to a first embodiment of the present disclosure.

First, a receiving device according to an embodiment of the present disclosure will be described with reference to FIG. 1. FIG. 1 is a block diagram illustrating an exemplary overall configuration of a receiving device 10 according to the present embodiment. The receiving device 10 of the present embodiment receives a broadcast signal from a digital satellite broadcast, and decodes encoded data related to video and audio included in the received broadcast signal. Subsequently, the decoded data is transmitted to a display device (not illustrated), or recorded to a recording medium (not illustrated). Note that although the present embodiment presents the case of the receiving device 10 receiving a broadcast signal from a satellite broadcast as an example, the present disclosure is not limited thereto, and is also applicable to a receiving device that receives another broadcast wave, such as a digital terrestrial television broadcast or a cable television broadcast.

Additionally, in the receiving device 10 according to the present embodiment, a VCO (omitted from illustration in FIG. 1) is configured to have multiple oscillator frequency ranges of local oscillator frequencies called "sub-bands", and is designed to select an optimal sub-band from among multiple sub-bands according to a desired reception frequency. Also, in the present embodiment, and similar to that described as an example of the related art, a variable capacitance element (varicap diode) is used as the frequency selecting element of the VCO. For this reason, in order to ascertain accurately the correspondence between the local oscillator frequency and the control voltage in a real operating environment, VCO calibration is made to be executed every time a tuner unit 4 discussed later changes channel.

With VCO calibration, an oscillator frequency is generated in each sub-band while locking the control voltage applied to the VCO at a prescribed value, and the obtained oscillator frequency is compared to a target frequency corresponding to a desired reception frequency to be received. Subsequently, the sub-band that generated an oscillator frequency whose difference with the reception frequency is within a prescribed range is selected as the sub-band corresponding to the reception frequency. The receiving device 10 of the present disclosure speeds up an internal clock when executing VCO calibration, and thereby shortens the channel selection (sub-band search) time for VCO calibration. As a result, it is possible to shorten the time during which the local oscillator frequency leaks into another tuner unit 4.

The receiving device 10 illustrated in FIG. 1 includes distributors 2-1 to 2-(n−1) (where n is a natural number) that distribute a broadcast signal (hereinafter also called a "high-frequency signal") received with an antenna 1, attenuators 3-1 to 3-n, and tuner units 4-1 to 4-n. Note in the following description, the distributors 2-1 to 2-(n−1) simply will be referred to as the distributor 2 when it is not necessary to individually distinguish the distributors. The terms attenuator 3 and tuner unit 4 are also used similarly.

The attenuators 3-1 to **3-*n* attenuate the input high-frequency signal. By setting the attenuation to an appropriate value, the high-frequency signal to input into each tuner unit 4** may be set to an appropriate level.

For example, if the attenuation to set in the attenuator 3 is set to a value that is inversely proportional to the distance from the antenna 1 (the distance over which the high-frequency signal is transmitted), the signal levels of the high-frequency signal input into each tuner unit 4 may be equalized. For example, a small attenuation is set in the attenuator 3 placed in front of a tuner unit 4 whose placement is separated from the antenna 1, such as the tuner unit **4-*n*, whereas a large attenuation is set for a tuner unit 4 placed close to the antenna 1, such as the tuner unit 4-1. By configuring settings in this way, it is possible to prevent the reception of each tuner unit 4** being different due to placement.

Note that although the present embodiment presents an example of the receiving device 10 that includes the attenuator 3, the present disclosure may also be applied to a receiving device that does not include the attenuator 3.

The tuner units 4-1 to **4-*n* extract and demodulate the high-frequency signal of a desired channel selected by a channel selector (not illustrated) from the high-frequency signal received by the antenna 1**. Subsequently, after performing error correction on the demodulated digital signal, the error-corrected Transport Stream (TS) packets are divided and respectively decoded to obtain a video signal and an audio signal.

(1-1-2. Exemplary Configuration of Tuner Unit)

Figure 2:
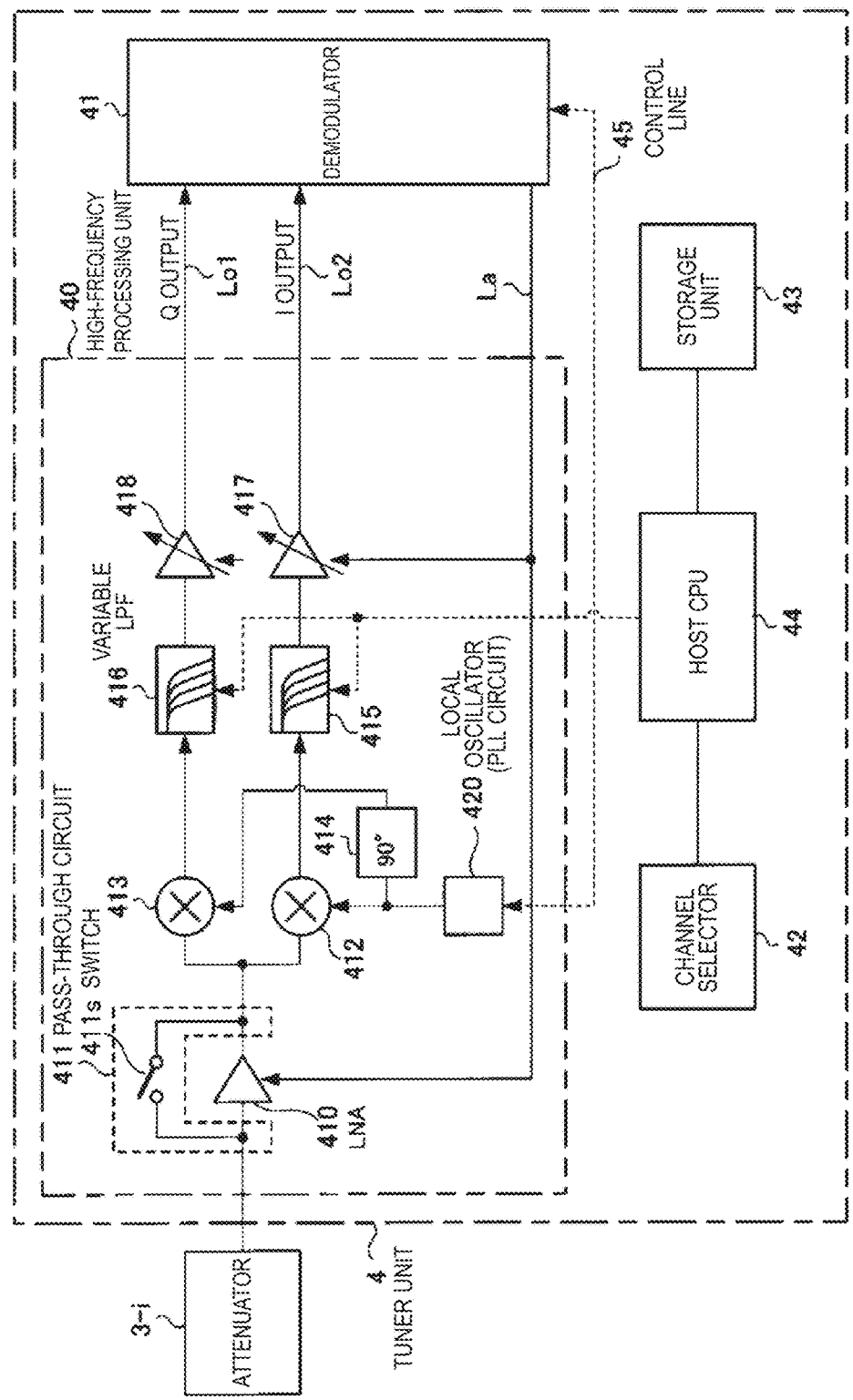
FIG. 2 is a block diagram illustrating an exemplary configuration of a tuner unit according to a first embodiment of the present disclosure.

Next, an exemplary internal configuration of each tuner unit 4 will be described with reference to the block diagram in FIG. 2. The tuner unit 4 of the present embodiment is configured to detect by direct conversion a high-frequency signal in the 1 GHz to 2 GHz band output from the antenna 1 (see FIG. 1), and obtain a received signal from 950 MHz to 2150 MHz. Note that the frequency band of the received signal is not limited to this example, and may also be set to other values. Also, the detection technique is not limited to direct conversion, and another technique such as superheterodyne may also be applied depending on the type of broadcast wave to receive. Also, the high-frequency signal in the 1 GHz to 2 GHz band output from the antenna 1 (see FIG. 1) is an intermediate frequency (IF) signal that has been frequency-converted by a circuit inside the antenna.

The tuner unit 4 is equipped with a high-frequency processing unit 40, a demodulator 41, a channel selector 42, a storage unit 43, and a host central processing unit (CPU) 44 that acts as a control unit.

The high-frequency processing unit 40 is equipped with a low-noise amplifier (LNA) 410, a pass-through circuit 411, an I/Q mixer 412, and an I/Q mixer 413. Also included are a local oscillator 420 (PLL circuit), a phase shifter 414, a variable low-pass filter (LPF) 415, a variable LPF 416, a baseband amp 417, and a baseband amp 418.

The LNA 410 amplifies the high-frequency signal output from the attenuator 3, while also attenuating the local oscillator frequency and corresponding harmonic and subharmonic oscillations leaking in from the downstream local oscillator 420. The pass-through circuit 411 includes a switch **411*s*, and switches the switch 411*s* on or off. Specifically, when calibrating the VCO (omitted from illustration in FIG. 2) inside the local oscillator 420, the switch 411*s* is switched off (open) to turn on the LNA 410. Otherwise, the switch 411*s* is kept on. When executing VCO calibration, the switch 411*s* is switched off to connect the LNA 410 to the downstream circuit, thereby attenuating the local oscillator frequency and corresponding harmonic and subharmonic oscillations which leak out from the downstream local oscillator 420 and which are transmitted to the signal input terminal (not illustrated). Consequently, it is possible to prevent the local oscillator frequency and corresponding harmonic and subharmonic oscillations leaking out from the LNA 410 from reaching the signal input terminal (not illustrated) and sneaking into another tuner unit 4** via the signal line.

An IF signal amplified by the LNA 410 or an IF signal input by passing through the pass-through circuit 411 is input into the I/Q mixer 412 and the I/Q mixer 413. The I/Q mixer 412 mixes the input IF signal with a local oscillator signal output from the local oscillator 420, and extracts the I-phase baseband signal. The I/Q mixer 413 mixes the input IF signal with a local oscillator signal output from the local oscillator 420 and phase-shifted 90° by the phase shifter 414, and extracts the Q-phase baseband signal.

The local oscillator 420 generates a local oscillator frequency of the same frequency as the reception frequency to be received by the antenna 1, and supplies the generated local oscillator frequency to the I/Q mixer 412 and the phase shifter 414. The phase shifter 414 shifts the phase of the local oscillator frequency output from the local oscillator 420 by 90°, and inputs the phase-shifted signal into the I/Q mixer 413.

When conducting demodulation using I/Q signals, the local oscillator frequency is typically set to a value of at least double the reception frequency, for reasons such as easily obtaining a 90° phase difference signal. Since the tuner unit 4 according to the present embodiment receives a broadcast wave of a satellite broadcast from 950 MHz to 2150 MHz as discussed earlier, the local oscillator frequency range of the local oscillator frequency is treated as the approximately doubled range from 2200 MHz to 4400 MHz.

The I-phase baseband signal extracted by the I/Q mixer 412 is input into the variable LPF 415, while the Q-phase baseband signal extracted by the I/Q mixer 413 is input into the variable LPF 416. The variable LPF 415 limits the frequency of the I-phase baseband signal to a prescribed band, and outputs to the baseband amp 417. The variable LPF 416 limits the frequency of the Q-phase baseband signal to a prescribed band, and outputs to the baseband amp 418.

The variable LPF 415 and the variable LPF 416 are each configured as a programmable variable LPF, and the cutoff frequency is configured as a set value in a register (not illustrated). By varying the set value to configure in the register, the frequency characteristics that the LPF allows to pass through may be varied, thereby enabling the reception of various broadcast waves with a variety of occupied bandwidths.

The baseband amp 417 adjusts the gain of the I-phase baseband signal output from the variable LPF 415, and outputs to the demodulator 41. The baseband amp 418 adjusts the gain of the Q-phase baseband that passed through the variable LPF 416, and outputs to the demodulator 41. The gain of the baseband amp 417 and the baseband amp 418 as well as the gain of the LNA 410 are adjusted on the basis of an AGC control signal input from the demodulator 41 via a control line 45.

The demodulator 41 demodulates the input I-phase/Q-phase baseband signals according to a prescribed demodulation scheme, and applies error correction such as Reed-Solomon codes to obtain a TS signal. The TS signal demodulated by the demodulator 41, after being demultiplexed by a multiplexer/demultiplexer (not illustrated), is decoded by a decoding unit (also not illustrated), and extracted as a video signal and an audio signal.

The channel selector 42 is configured as a remote control or the like, and transmits information about a channel selected by the user to the host CPU 44 as channel selection data. The storage unit 43 is made up non-volatile memory or the like, and stores channel selection data and corresponding configuration data. Note that the generation of channel selection data is not conducted only when a channel is selected via the channel selector 42 configured as a remote control. For example, channel selection data is also generated when a specific program is selected via an electronic program guide (EPG), or when a specific program is selected as a scheduled recording.

The host CPU 44 controls the components constituting the tuner unit 4. For example, on the basis of channel selection data selected by the channel selector 42, the host CPU 44 retrieves configuration data required to receive the broadcast on the selected channel from the storage unit 43, and on the basis of the retrieved configuration data, configures the components of the tuner unit 4. In addition, the host CPU 44 also controls the speedup of the internal clock when executing VCO calibration. An internal clock speedup process will be discussed in detail later. Furthermore, when executing VCO calibration, the host CPU 44 also opens the switch 411s of the pass-through circuit 411 discussed earlier, conducts control to select the LNA 410, and conducts control to lower the oscillator current of the VCO discussed later.

(1-1-3. Exemplary Configuration of VCO)

Next, an exemplary configuration of the VCO 430 inside the local oscillator 420 will be described with reference to the block diagram in FIG. 3. The VCO 430 is made up of an LC tuning circuit 431 and an oscillator 432, and a variable current source 433 is connected to the oscillator 432. The LC tuning circuit 431 includes tuning capacitors 31-1 to 31-$m$ corresponding to each sub-band, a voltage-controlled tuning capacitor 33, and a tuning inductor 34. The elements constituting the LC tuning circuit 431 are connected in parallel, and switches 32-1 to 32-$m$ are connected in series to each of the tuning capacitors 31-1 to 31-$m$.

Note that in the following description, the tuning capacitors 31-1 to 31-$m$ simply will be referred to as the tuning capacitor 31 when it is not necessary to individually distinguish the tuning capacitors. Similarly, the switches 32-1 to 32-$m$ simply will be referred to as the switch 32 when it is not necessary to individually distinguish the switches.

Figure 4:
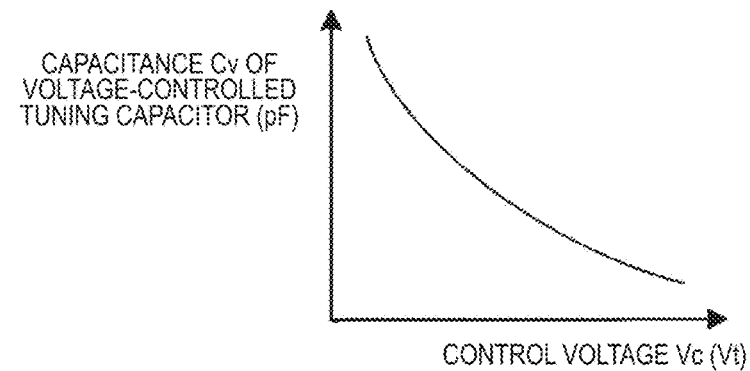
FIG. 4 is a diagram illustrating the characteristics of the capacitance of a voltage-controlled tuning capacitor versus the control voltage, as well as the correspondence between the oscillator frequency of an oscillator and the control voltage, according to a first embodiment of the present disclosure, in which A illustrates the characteristics of the capacitance of a voltage-controlled tuning capacitor versus the control voltage, and B illustrates the characteristics of the capacitance of a voltage-controlled tuning capacitor versus the control voltage.
Figure 4:
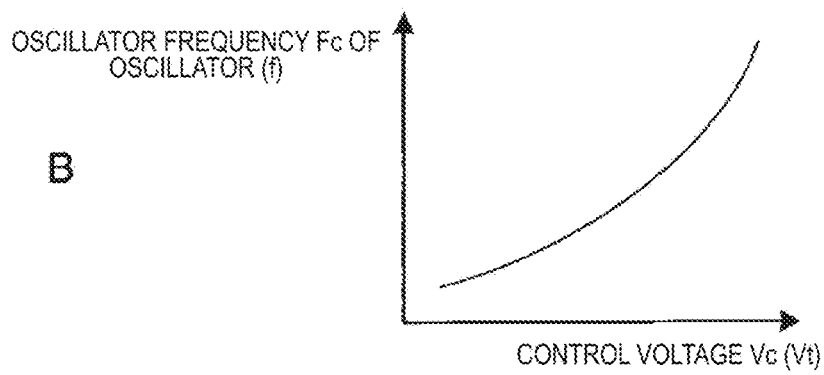

The tuning capacitor 31 is made up of an on-chip diode, for example. The voltage-controlled tuning capacitor 33 is a varicap diode for controlling capacitance, in which its own capacitance Cv is controlled by a control voltage Vc applied to a Vc terminal (not illustrated). FIG. 4A is a diagram illustrating the relationship between the control voltage Vc and the capacitance Cv of the voltage-controlled tuning capacitor 33. The horizontal axis represents the control voltage Vc (Vt), while the vertical axis represents the capacitance Cv (pF) of the voltage-controlled tuning capacitor 33. As illustrated in FIG. 4A, the capacitance Cv of the voltage-controlled tuning capacitor 33 increases as the applied control voltage Vc becomes smaller, and the capacitance Cv of the voltage-controlled tuning capacitor 33 decreases as the applied control voltage Vc becomes larger.

The tuning inductor 34 is made up of an on-chip inductor, for example. In addition, the oscillator frequency of the oscillator 432 is controlled by the LC tuning circuit 431 made up of the tuning capacitor 31 switched on by the switch 32, the voltage-controlled tuning capacitor 33, and the tuning inductor 34. In the case of supposing that the tuning capacitor 31 is made up of one capacitor, the oscillator frequency Fc of the oscillator 432 oscillated by the LC tuning circuit 431 may be computed according to the following Expression 1. In the following Expression 1, "L" represents the inductance of the tuning inductor 34, while "C" represents the capacitance of the tuning capacitor 31.

$$\text{Oscillator frequency } Fc = \frac{1}{2\pi\sqrt{LC}} \quad \text{Expression 1}$$

FIG. 4B is a diagram illustrating the relationship between the control voltage Vc and the oscillator frequency Fc of the oscillator 432. The horizontal axis represents the control voltage Vc (Vt), while the vertical axis represents the oscillator frequency Fc (f) of the oscillator 432. As illustrated in FIG. 4B, the oscillator frequency Fc of the oscillator 432 decreases as the applied control voltage Vc becomes smaller, and the oscillator frequency Fc of the oscillator 432 increases as the applied control voltage Vc becomes larger.

In practice, the tuning capacitor 31 is made up of m capacitors, and the oscillator frequency Fc of the oscillator 432 in this case may be computed according to the following Expression 2. In the following Expression 2, "L" represents the inductance of the tuning inductor 34, while "C32-1" to "C32-$m$" represent the capacitance of each of the tuning capacitors 31-1 to 31-$m$.

$$\text{Oscillator frequency } Fc = \frac{1}{2\pi\sqrt{L \times (Cv + C32\text{-}1 + C32\text{-}2 + \ldots C32\text{-}m)}} \quad \text{Expression 2}$$

In other words, the oscillator frequency Fc lowers as the number of tuning capacitors 31 switched on by the switches 32 (see FIG. 3) increases, and the oscillator frequency Fc rises as the number of tuning capacitors 31 switched on by the switches 32 decreases.

Figure 3:
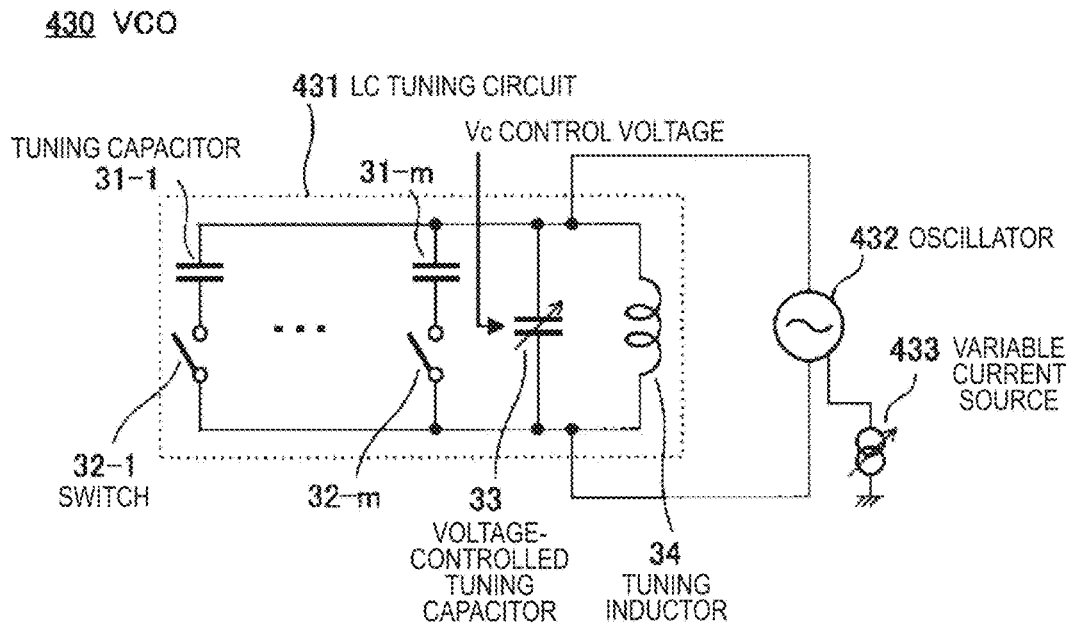
FIG. 3 is a block diagram illustrating an exemplary configuration of a VCO according to a first embodiment of the present disclosure.
Figure 5:
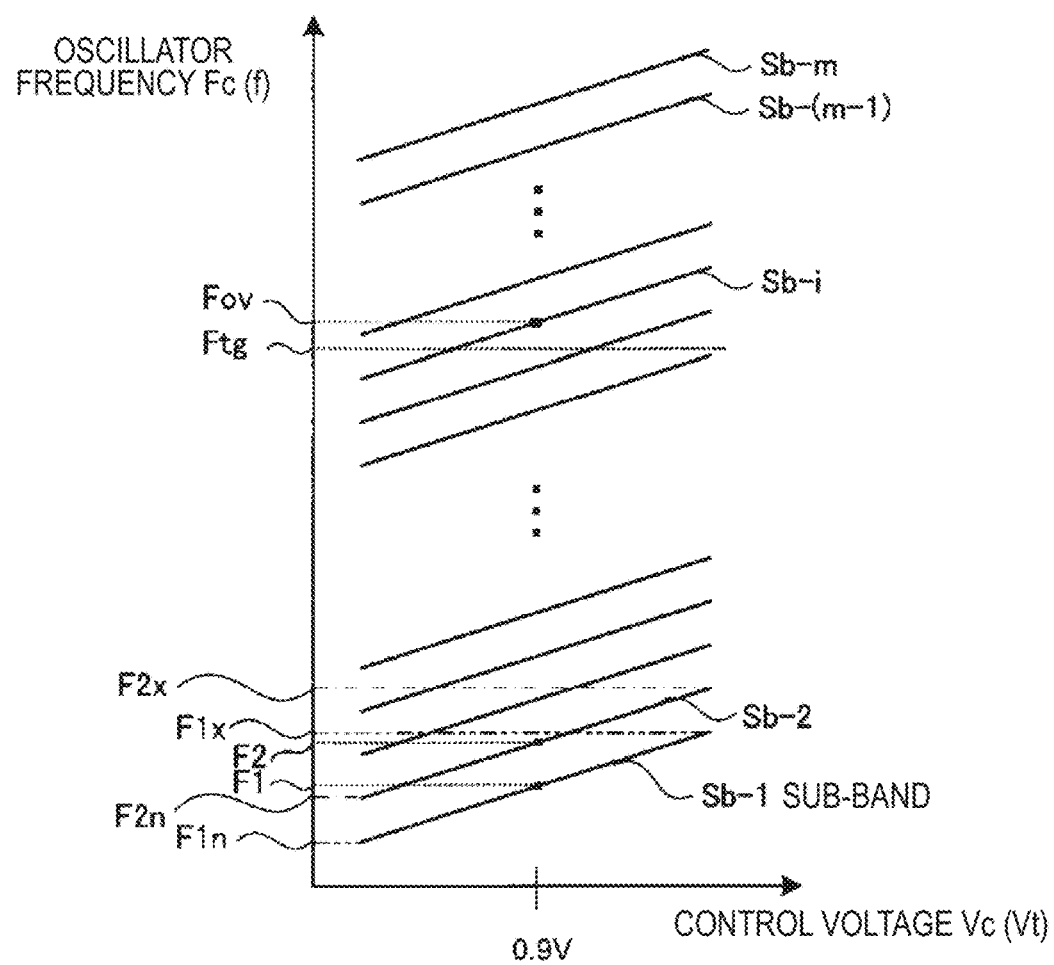
FIG. 5 is an explanatory diagram illustrating an exemplary configuration of sub-bands according to a first embodiment of the present disclosure.

FIG. 5 is a diagram illustrating the relationship between the oscillator frequency Fc of an LC tuning circuit according to the present embodiment, or in other words, of the oscillator 432 oscillated by the LC tuning circuit 431 illustrated in FIG. 3, and the control voltage Vc. The horizontal axis represents the control voltage Vc (Vt), while the vertical axis represents the oscillator frequency Fc (f) of the oscillator 432. When the tuning capacitor 31-1 to the tuning capacitor 31-$m$ illustrated in FIG. 3 are all switched on and the control voltage Vc is set to a prescribed value (such as 0.9 V, for example), the oscillator frequency Fc of the oscillator 432 takes the value labeled "F1" in the graph.

Subsequently, the oscillator frequency Fc varies as the applied control voltage Vc varies. When the value of the oscillator frequency Fc is varied from a minimum value to a maximum value, the oscillator frequency Fc transitions from an oscillator frequency F1$n$ as a minimum value to an oscillator frequency F1$x$ as a maximum value. In other words, the band that the oscillator frequency Fc is able to cover while the tuning capacitors 31 are all switched on is a band from the oscillator frequency F1$n$ to the oscillator frequency F1$x$. In the present embodiment, the respective bands of the oscillator frequency Fc, which change depending on the number of tuning capacitors 31 switched on, are designated "sub-bands". In FIG. 5, the sub-band covered by the oscillator frequency Fc obtained while the tuning capacitors 31 are all switched on is labeled as the sub-band Sb-1.

If the value of the control voltage Vc is kept fixed, and only the tuning capacitor 31-1 (see FIG. 3) among the tuning capacitors 31 is switched off, for example, the LC tuning circuit 431 oscillates at an oscillator frequency F2, which is a higher frequency than the oscillator frequency F1. Additionally, by increasing or decreasing the control voltage Vc, the oscillator frequency Fc of the oscillator 432 varies according to the value of the control voltage Vc in the range from a minimum oscillator frequency F2n to a maximum oscillator frequency F2x. In FIG. 5, the band of the oscillator frequency Fc that oscillates while only one of the tuning capacitors 31 is switched off is labeled as the sub-band Sb-2.

As discussed earlier, the tuning capacitor 31 in the LC tuning circuit 431 is made up of an on-chip varicap diode. Consequently, the variation range of the capacitance of each tuning capacitor 31 is small, approximately several pF (0 V to 3.3 V). In the present embodiment, such a tuning capacitor 31 with a small variation range is plurally provided to constitute multiple sub-bands Sb, thereby enabling a wide range of coverage as the oscillator frequency range of the local oscillator frequency.

If the sub-band Sb corresponding to a reception frequency is selected, subsequently, a feedback control is conducted by the local oscillator 420 configured as a PLL circuit, thereby synchronizing a frequency obtained by dividing the oscillator frequency Fc of the oscillator 432 with the reception frequency. However, since a varicap diode (variable capacitance element) is used as the voltage-controlled tuning capacitor 33 of the LC tuning circuit 431, the capacitance-voltage (C-V) characteristics thereof vary depending on factors such as the ambient temperature and humidity during use, and the power source voltage. In other words, there is a possibility that a change in these conditions may also change the sub-band Sb corresponding to the reception frequency. For this reason, in the present embodiment, a search for the sub-band Sb corresponding to the reception frequency, or "VCO calibration", is carried out every time a channel is selected, for example, thereby making it possible to absorb inconsistencies in the C-V characteristics of the voltage-controlled tuning capacitor 33.

Figure 6:
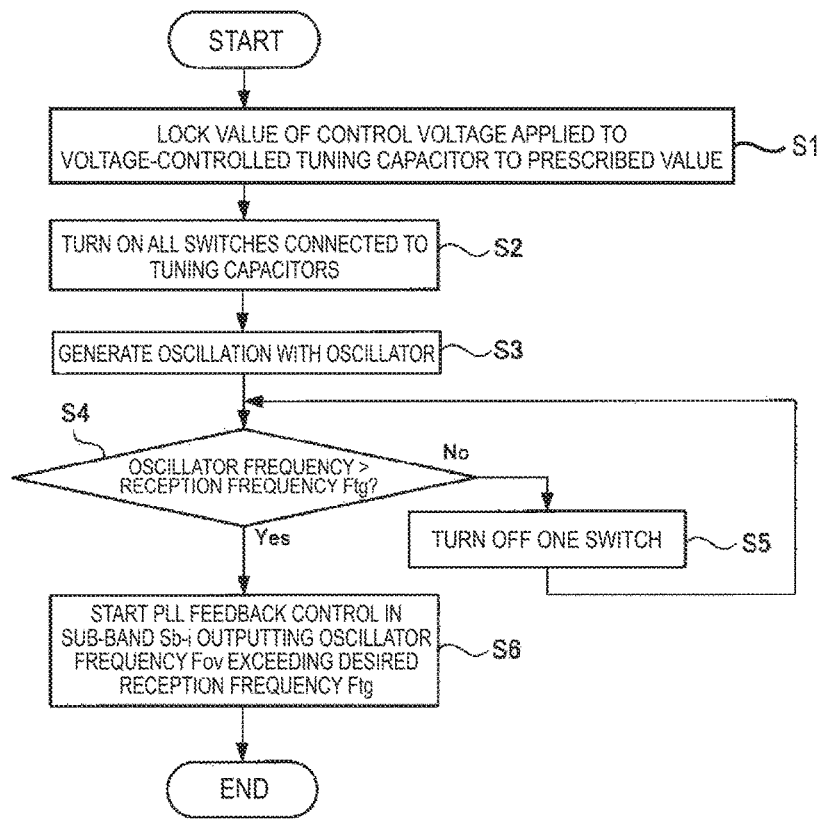
FIG. 6 is a flowchart illustrating an example of a sub-band search process according to a first embodiment of the present disclosure.

At this point, an example of the operation of VCO calibration according to the present embodiment will be described with reference to FIG. 5 and the flowchart in FIG. 6. As illustrated in FIG. 6, first, the control voltage Vc to apply to the voltage-controlled tuning capacitor 33 is locked to a prescribed value, such as 0.9 V, for example, by control logic discussed later (step S1), and the switches 32 connected to the tuning capacitors 31 are all switched on (step S2). The oscillator 432 is oscillated in this state (step S3), and it is judged whether or not the oscillator frequency Fc of the oscillator 432 is greater than a target frequency Ftg of a PLL lock determined by the reception frequency (step S4).

If the oscillator frequency Fc is less than or equal to the target frequency Ftg, one of the switches 32 connected to the tuning capacitors 31 is switched off (step S5), and after that, the judgment in step S4 is made. Subsequently, when the oscillator frequency Fc is judged to be greater than the target frequency Ftg, a PLL feedback control is started in the sub-band Sb-i (where i is a natural number) that outputs an oscillator frequency Fov which is a greater frequency than the target frequency Ftg (step S6).

As illustrated in FIG. 5, the oscillator frequency Fov that is greater than the target frequency Ftg refers to an oscillator frequency with a value greater than the target frequency Ftg from among the oscillator frequencies Fc generated by the control voltage Vc whose value was locked in step S1 of FIG. 6. The oscillator frequency Fc takes a different value depending on which sub-band Sb was selected, or in other words, how many stages of tuning capacitors 31 are connected. In the present embodiment, the sub-band Sb-i generating the oscillator frequency Fov greater than the target frequency Ftg is treated as the sub-band Sb corresponding to the reception frequency.

Note that since the objective is to search for the sub-band Sb that generates an oscillator frequency Fc with a small difference from the target frequency Ftg (within a prescribed range), the oscillator frequency Fc is not strictly required to be a greater value than the target frequency Ftg. For example, from among the sub-band Sb-i that generated the oscillator frequency Fov and the sub-band Sb-(i−1) found in the previous search, the sub-band Sb that generated the oscillator frequency Fc closer to the target frequency Ftg may also be treated as the sub-band Sb corresponding to the reception frequency.

Information indicating which sub-band Sb corresponds to the reception frequency is kept for the period until the PLL locks in the sub-band Sb judged to correspond to the reception frequency. Information about the sub-band Sb is indicated by the number of connected stages of tuning capacitors 31, for example. Note that, in addition to information about the number of stages of tuning capacitors 31, information about the oscillator frequency Fov with a greater value than the target frequency Ftg may also be kept as the information about the sub-band Sb. Additionally, correspondence information between the reception frequency and the sub-band Sb may be stated in a table or the like, for example, and kept even after the PLL lock.

The discussion will now return to FIG. 3 and again describe the configuration of the VCO 430 according to the present embodiment. As discussed earlier, the tuning inductor 34 is configured as an on-chip inductor. For this reason, the inductance is low, from 0 nH to 20 nH, and the Q factor also takes a low value of 10 or less. In the case of oscillating the VCO 430 with such an tuning inductor 34 and the tuning capacitor 31 and voltage-controlled tuning capacitor 33 discussed earlier, ordinarily only oscillation at a high frequency in the GHz band is possible. Consequently, the present embodiment is configured to divide the oscillator frequency generated by the VCO 430 within a range from the original oscillation to 1/32 using a frequency divider (not illustrated), and thereby cover the oscillator frequency range of 2200 MHz to 4400 MHz which is approximately double the satellite broadcast from 950 MHz to 2150 MHz.

Figure 7:
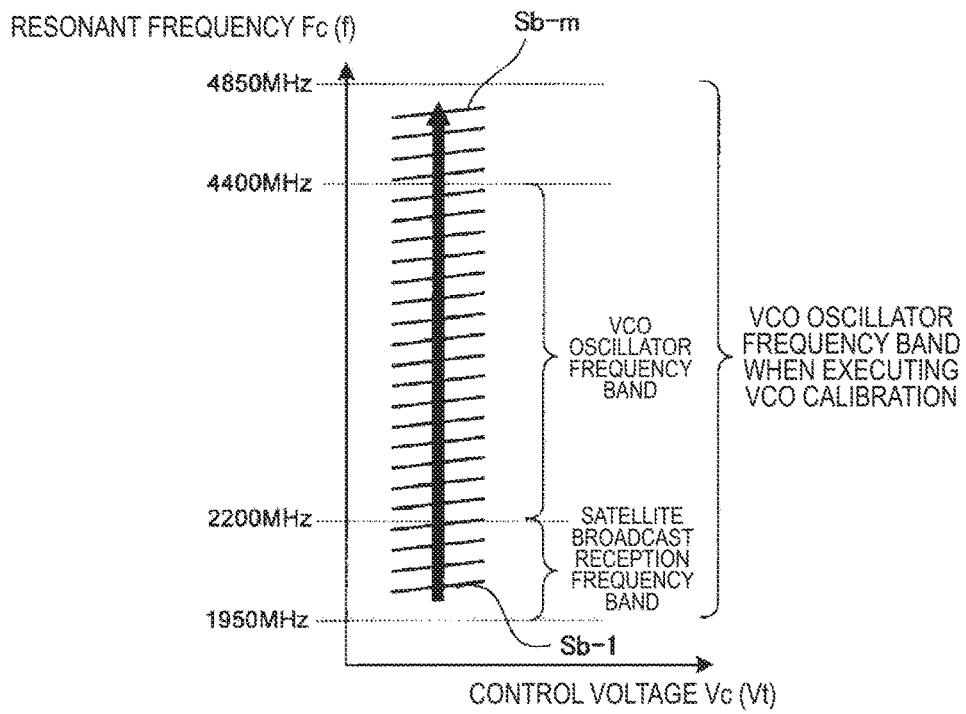
FIG. 7 is an explanatory diagram illustrating an example of a band of oscillator frequencies covered by each sub-band according to a first embodiment of the present disclosure.

FIG. 7 is an explanatory diagram illustrating an exemplary configuration of sub-bands Sb according to the present embodiment, in which the vertical axis represents frequency (MHz) and the horizontal axis represents control voltage. The multiple solid lines proceeding diagonally upward to the right illustrated in the graph of FIG. 7 represent each of the sub-bands Sb. The sub-band Sb-1 with the lowest frequency represents the oscillator frequency band varied in the state in which the tuning capacitors 31 illustrated in FIG. 3 are all connected. Also, the sub-band Sb-m with the highest frequency represents the oscillator frequency band varied in the state in which the tuning capacitors 31 are all switched off.

As discussed earlier, since it is sufficient for the VCO 430 to be able to oscillate at a local oscillator frequency in the range from 2200 MHz to 4400 MHz, in principle it would be sufficient for the range of frequencies covered by the multiple sub-bands Sb also to be from 2200 MHz to 4400

MHz. However, in the receiving device 10 according to the present embodiment, the frequency range of the oscillator 432 is configured to be from 1950 MHz to 4850 MHz, so as to avoid a phenomenon of being unable to obtain a desired local oscillator frequency during actual operation due to inconsistencies in the voltage-controlled tuning capacitor 33 configured with a varicap diode. In other words, sub-bands Sb also exist in the domain outside of the 2200 MHz to 4400 MHz band required as the band of local oscillator frequencies. Consequently, the domain from 1950 MHz to 2200 MHz and the domain from 4400 MHz to 4850 MHz are included in the target of VCO calibration executed to search for a sub-band Sb.

However, by taking such a configuration, the band from 1950 MHz to 2200 MHz of input frequencies of the VCO 430 when receiving a satellite broadcast also becomes included among the frequency bands to scan during VCO calibration. For this reason, interference with another tuner unit 4 occurs not only when a frequency scanned during VCO calibration completely matches a frequency currently selected by another tuner unit 4, but also when an extremely low frequency of 1950 MHz or less is scanned, for example. If the frequency range covered by the sub-bands Sb is set the exact same range as the oscillator frequency range of the local oscillator frequency, a similar phenomenon occurs when a frequency scanned during VCO calibration completely matches a frequency currently selected by another tuner unit 4.

To solve such problems, in the receiving device 10 of the present disclosure, the internal clock (the clock frequency of the host CPU 44) is sped up when executing VCO calibration. In other words, by shortening the time itself of the sub-band Sb search conducted as part of executing VCO calibration, the time of exerting interference on another tuner unit 4 currently receiving a prescribed frequency is shortened. An internal clock speedup process will be described with reference to the block diagram of the local oscillator 420 (PLL circuit) illustrated in the next FIG. 8.

Figure 8:
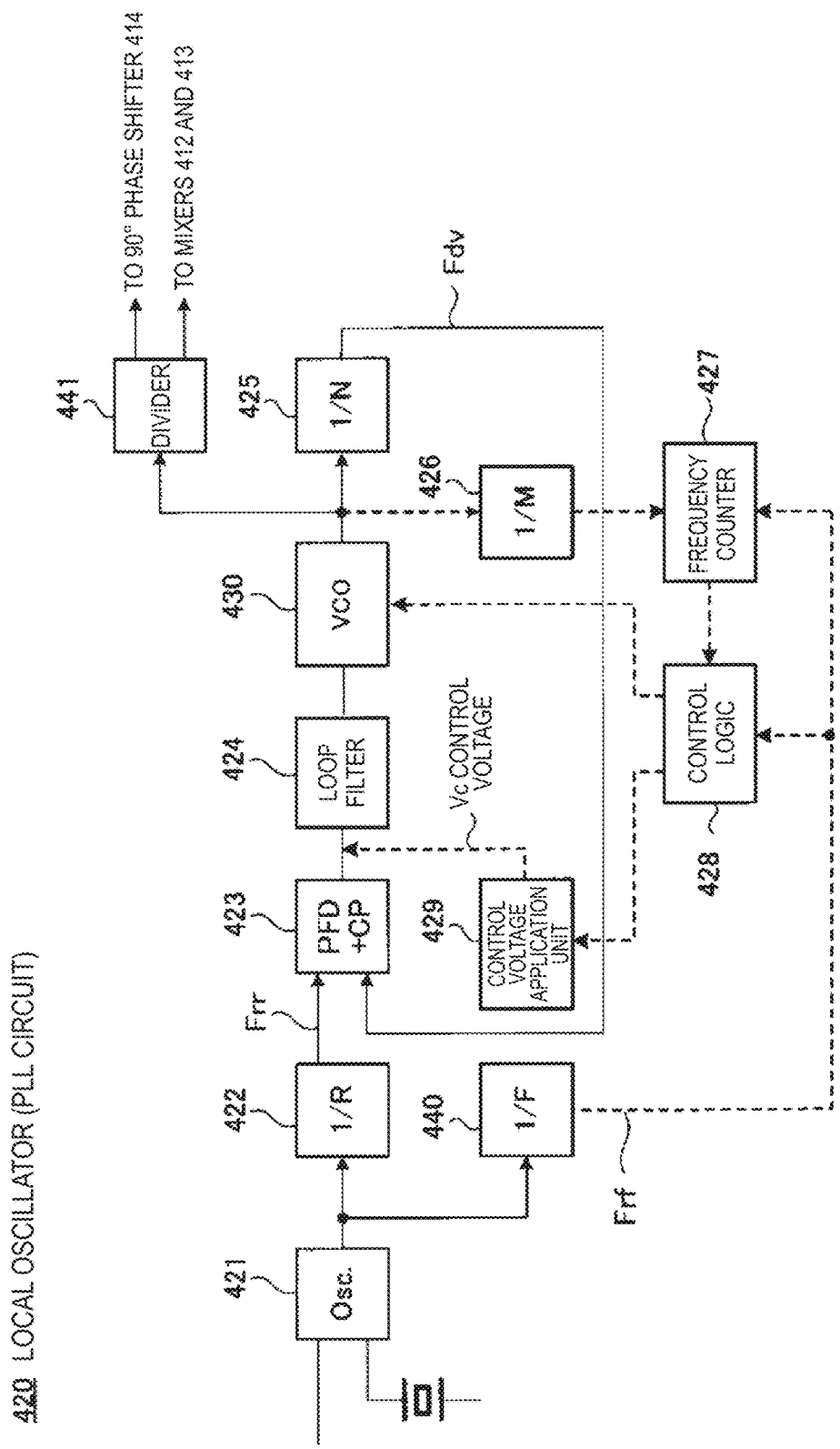
FIG. 8 is a block diagram illustrating an exemplary configuration of a local oscillator according to a first embodiment of the present disclosure.

The local oscillator 420 illustrated in FIG. 8 is configured as a PLL circuit, and includes a crystal oscillator 421 that generates a reference signal, a frequency divider 422, a phase comparator 423, a loop filter 424, the VCO 430, and a variable frequency divider 425. In addition, the local oscillator 420 includes a frequency divider 426, a frequency counter 427, control logic 428, a control voltage application unit 429, a frequency divider 440, and an arithmetic division circuit (divider) 441.

The frequency divider 422 divides the reference frequency generated by the crystal oscillator 421 using 1/R (divide-by-R) to generate a comparison frequency Frr, which is supplied to the phase comparator 423. The phase comparator 423 compares the phase of the comparison frequency Frr, which is the frequency obtained by the division of the frequency divider 422, to the phase of a divided frequency Fdv, which is generated by the VCO 430 and divided by the variable frequency divider 425. Subsequently, a signal corresponding to the phase difference (error signal) is generated and input into the loop filter 424. The loop filter 424 converts the error signal input from the phase comparator 423 into a DC voltage, and applies the DC voltage to the VCO 430. The VCO 430 changes the oscillator frequency according to the magnitude of the DC voltage applied by the loop filter 424, and supplies the generated oscillator frequency to the variable frequency divider 425. As a result of conducting such a PLL feedback control, the phase of the divided frequency Fdv locks onto the phase of the comparison frequency Frr, or in other words, becomes the same frequency as the comparison frequency Frr.

The variable frequency divider 425 generates the divided frequency Fdv by taking the 1/Nth (divide-by-N) or the Nth multiple of the reference frequency generated by the crystal oscillator 421. In the present embodiment, the values of the division ratio R of the frequency divider 422 and the division ratio N of the variable frequency divider 425 are adjusted to switch the overall division ratio from "2" to "32". In a PLL circuit configured in this way, the PLL converges when the difference between the local oscillator frequency generated by the VCO 430 and the desired frequency becomes sufficiently small.

The frequency divider 426 is selected during VCO calibration, divides the oscillator frequency generated by the VCO 430 using 1/M (divide-by-M), and inputs the divided frequency into the frequency counter 427. The division ratio M in the frequency divider 426 is set to a value such as "32", for example. Note that in the present embodiment, since the local oscillator frequency band of the VCO 430 is set to a value that is double the reception frequency band, the frequency divider 426 that divides the frequency to input into the frequency counter 427 is provided. However, in the case of configuring the local oscillator frequency band to be equal to the reception frequency band, the frequency divider 426 may also not be provided.

The frequency counter 427 measures the local oscillator frequency Fc of the VCO 430 by counting the frequency divided by the frequency divider 426 as input, and computes the difference between the measured local oscillator frequency Fc and the comparison frequency Frr generated on the basis of the desired target frequency Ftg. The difference computation process is conducted in each of the sub-bands Sb that generate the oscillator frequencies F1, F2, ..., Fok illustrated in FIG. 5. In other words, the difference computation process is conducted until the sub-band Sb that generates the oscillator frequency Fov greater than the comparison frequency Frr generated on the basis of the target frequency Ftg is discovered.

The control logic 428 controls the VCO 430 and the control voltage application unit 429 on the basis of information about the difference computed by the frequency counter 427. Specifically, when the oscillator frequency Fc in the currently selected sub-band Sb is judged to be lower than the comparison frequency Frr, a command for switching the sub-band sb is issued to the VCO 430. Also, the control voltage application unit 429 is controlled to lock the control voltage Fv to a value such as 0.9 V, for example. When the oscillator frequency Fc in the currently selected sub-band Sb is judged to exceed the comparison frequency Frr, a control is conducted to switch the source of voltage application with respect to the loop filter 424 from the control voltage application unit 429 to the phase comparator 423. The control voltage application unit 429 applies the control voltage indicated by the control logic 428 to the VCO 430 via the loop filter 424.

In other words, while searching for the sub-band Sb that generates the oscillator frequency Fov, the oscillator frequency Vc of the VCO 430 is controlled by the loop formed by the VCO 430, the frequency divider 426, the frequency counter 427, the control logic 428, the control voltage application unit 429, and the loop filter 424. After the sub-band Sb that generates the oscillator frequency Fov is discovered, the oscillator frequency Vc of the VCO 430 is controlled by the loop formed by the VCO 430, the variable frequency divider 425, the phase comparator 423, and the loop filter 424. Subsequently, the PLL converges when the difference between the oscillator frequency Vc generated by the VCO 430 and the desired reception frequency becomes sufficiently small.

The frequency divider 440 divides the reference frequency generated by the crystal oscillator 421 using 1/F (divide-by-F) to generate a comparison frequency, which is supplied to the frequency counter 427 and the control logic 428. In the present embodiment, the division ratio F of the frequency divider 440 is made to differ between when channel selection is actually being conducted (a broadcast signal is being received) and when VCO calibration is being executed. Specifically, when the reference frequency of the crystal oscillator 421 is set to 16 MHz, for example, the division ratio F during channel selection is taken to be "16", whereas the division ratio F while executing VCO calibration is taken to be "1".

The clock frequency of the local oscillator 420 configured as a PLL circuit takes the value obtained by dividing the reference frequency generated by the crystal oscillator 421 by the division ratio F. In other words, by changing the division ratio F of the frequency divider 440 to "1", for example, when executing VCO calibration, the clock frequency of the local oscillator 420 becomes 16 MHz (reference frequency)/1 (division ratio F)=16 MHz. The clock frequency of the local oscillator 420 during normal channel selection is 16 MHz/16=1 MHz, thus demonstrating that the clock frequency of the PLL circuit is sped up when executing VCO calibration. Consequently, since the minimum step length for turning over the frequency counter 427 becomes finer (in the present embodiment, 1 MHz), the interval at which the control voltage is applied to the local oscillator 420 also becomes shorter. In other words, the time during which a local oscillator frequency search is conducted in one sub-band Sb becomes shorter.

The arithmetic division circuit 441 conducts a process of arithmetically dividing the local oscillator frequency generated by the VCO 430 to match the band of the reception frequency.

As a result of conducting such control, the VCO calibration execution time (the time of searching for the sub-band Sb that generates the oscillator frequency Fov) becomes shorter, and thus the time itself during which the local oscillator frequency as well as corresponding harmonic and subharmonic oscillations leak out from the VCO 430 also becomes shorter. The inventors measured the actual times during which a search for local oscillator frequency in a single sub-band Sb is conducted, and found the time to be 64 µs when the division ratio F is set to "16", and 4 µs when set to "1".

In the present embodiment, the value of the division ratio F of the frequency divider 440 is set with reference to the processing time over which the demodulator 41 conducts error correction. In other words, the value of the division ratio F is decided so that the search time for a sub-band Sb that generates the oscillator frequency Fov is kept within the error correction processing time. The error correction processing time may be computed according to the following formula.

Symbol length(per frame)/broadcast signal transmission rate  Expression 3

The "symbol length (per frame)" is computed from the following formula.

(Number of bits correctable by error correction [units: bits])×(block interleave length [units: frames])×symbol rate  Expression 4

For example, when the type of error correction conducted by the demodulator 41 is "shortened Reed-Solomon (204, 188)", and the desired broadcast wave to receive is a BS digital broadcast, the parameters to substitute into the above Expression 1 and Expression 2 become values like the following.

Number of bits correctable by error correction=number of bytes correctable by error correction: 8 [bytes]×8 [frames]=64 [bits]

Block interleave length: 8 [frames]
Code rate: ½
Broadcast signal transmission rate: 28.86 [Mb/s]
Consequently, according to Expression 4, 64 [bits]×8 [frames]×½=256 [symbols]

is computed, and by substituting this value into Expression 3,

256 [symbols]/28.86 [Mb/s]=8.87 [µs]

is computed.

As discussed above, by setting "1" as the division ratio F of the frequency divider 440 of the local oscillator 420, the search time for a local oscillator frequency in a single sub-band Sb becomes "4 µs", or in other words, a shorter time than the error correction processing time of 8.87 µs. Consequently, even when a bit error occurs due to the execution of VCO calibration, the error is corrected by the error correction conducted by the demodulator 41.

Note that although an example of keeping the search time for a local oscillator frequency in a single sub-band Sb within the range of the error correction processing time is given herein, the configuration is not limited thereto. The division ratio F may also be set to another value insofar as the value enables a shortening of the search time for a local oscillator frequency in a single sub-band Sb compared to the original value.

[1-2. Example of Receiving Process]

Figure 9:
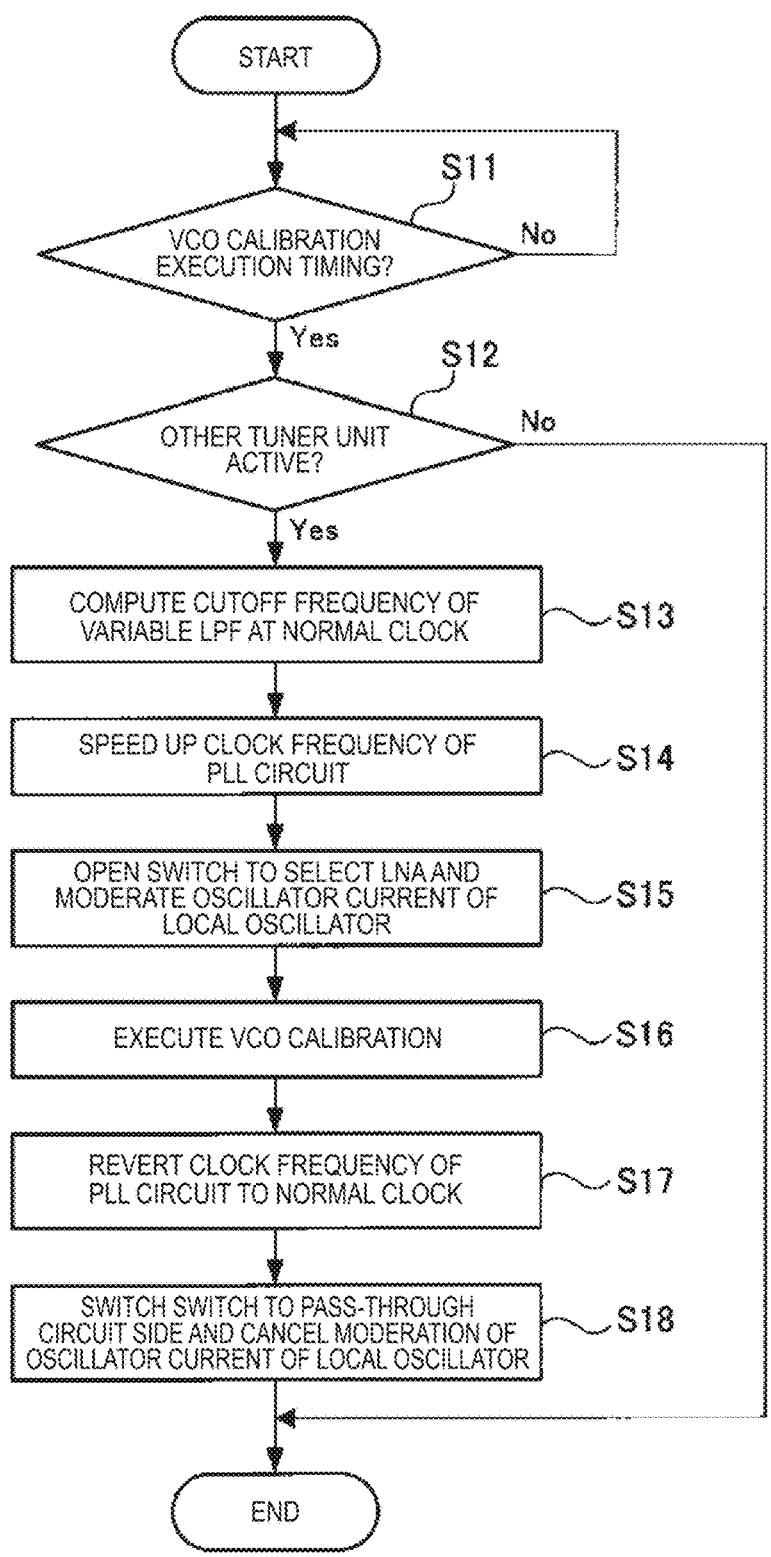
FIG. 9 is a flowchart illustrating an example of a receiving process according to a first embodiment of the present disclosure.

Next, an example of a receiving process conducted by the host CPU 44 (see FIG. 2) will be described with reference to the flowchart illustrated in FIG. 9. First, the host CPU 44 judges whether or not the VCO calibration execution timing has arrived (step S11). The VCO calibration execution timing is set to a prescribed timing, such as when the tuner unit 4 starts up, or when the reception channel is changed. If it is judged that the VCO calibration execution timing has not arrived, the judgment in step S11 continues to be conducted. If it is judged that the VCO calibration execution timing has arrived, next, the host CPU 44 judges whether or not another tuner unit 4 is active (step S12). If another tuner unit 4 is not active, the process ends.

If another tuner unit 4 is active, next, the cutoff frequency of the variable LPF 415 (see FIG. 2) is computed at the original clock frequency, without changing the setting of the division ratio F (step S13). Subsequently, a process of speeding up the clock frequency of the local oscillator 420 configured as a PLL circuit is conducted (step S14). In the present embodiment, by setting the division ratio F to a large value as discussed above, the clock frequency of the local oscillator 420 is sped up.

Next, the switch 411s of the pass-through circuit 411 (see FIG. 2) is opened to select the LNA 410 side, and in addition, a control to moderate the oscillator current of the local oscillator 420 is conducted (step S15). Subsequently, VCO calibration is executed (step S16). After VCO calibration is executed, a process of reverting the clock frequency of the PLL circuit back to the original frequency is conducted (step S17). Furthermore, the switch 411s of the pass-through circuit 411 is switched on to select the pass-through circuit side, and the control for moderating the local oscillator current with respect to the local oscillator 420 is cancelled (step S18).

Note that the order of the processes illustrated in step S14 and step S15 as well as the processes illustrated in step S17 and step S18 is not limited to the above order, and each may also be conducted in the reverse order.

According to the foregoing embodiment, since the internal clock (in the foregoing example, the clock frequency of the PLL circuit) is sped up when executing VCO calibration, the time to search for the sub-band Sb corresponding to the reception frequency is also sped up. As a result, the time itself during which the local oscillator frequency as well as corresponding harmonic and subharmonic oscillations leak into another tuner unit 4 is also shortened. Consequently, the time during which noise gets into the picture being demodulated by another tuner unit 4 also may be shortened.

In addition, according to the foregoing embodiment, the search time for a local oscillator frequency in a single sub-band Sb is kept within the range of the error correction processing time. For this reason, even when a bit error occurs due to the execution of VCO calibration, the error is corrected by the error correction conducted by the demodulator 41.

In addition, according to the foregoing embodiment, since the LNA 410 is selected when executing VCO calibration, the amount of leakage of the local oscillator frequency as well as corresponding harmonic and subharmonic oscillations is reduced by the LNA 410.

In addition, according to the foregoing embodiment, when executing VCO calibration, the oscillator current of the VCO 430 is moderated, thereby lowering the electrical energy of oscillation in the VCO 430, and decreasing the oscillator power of the VCO 430. Consequently, the amount of leakage of the local oscillator frequency as well as corresponding harmonic and subharmonic oscillations is also reduced.

In addition, according to the foregoing embodiment, the time of executing VCO calibration is shortened. Consequently, it becomes possible to decrease not only the effects of mutual interference between tuner units 4 occurring in the reception band of a broadcast signal, but also the effects of mutual interference between tuner units 4 occurring in the oscillator frequency band (GHz band) of the oscillator 432 in the VCO 430 (see FIG. 3).

2. Second Embodiment

Next, a second embodiment of the present disclosure will be described with reference to FIGS. 10 and 11. The configuration of the receiving device according to the present embodiment is taken to be an application of the same configuration as the receiving device 10 illustrated in FIG. 1. In other words, the configuration of the tuner units in the receiving device is the same as the configuration of the tuner units 4 illustrated in FIG. 2, the configuration of the VCO in each tuner unit is the same as the VCO 430 illustrated in FIG. 3, and the configuration of the local oscillator is the same as the local oscillator 420 illustrated in FIG. 8.

Figure 10:
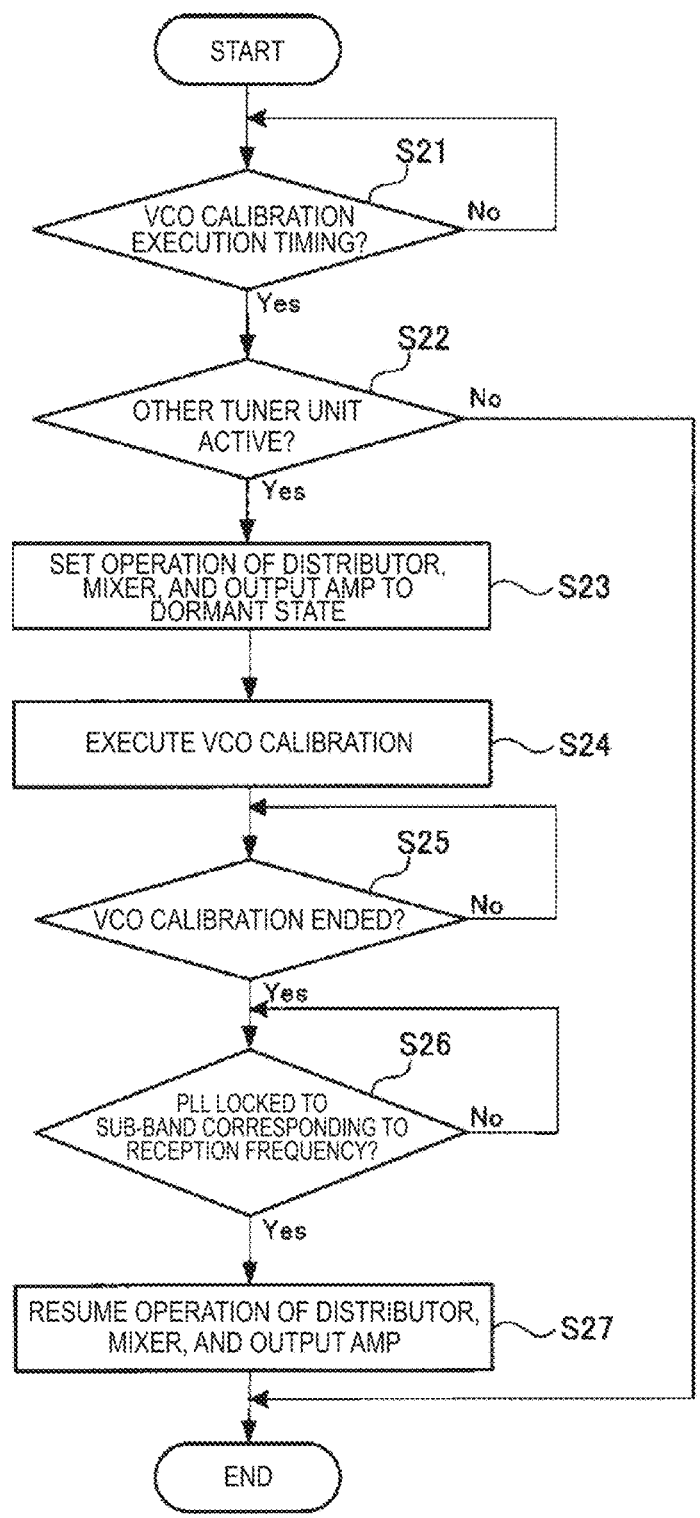
FIG. 10 is a flowchart illustrating an example of a receiving process according to a second embodiment of the present disclosure.

FIG. 10 is a flowchart illustrating a process conducted by a host CPU 44 that acts as a control unit (see FIG. 1) when executing VCO calibration. When executing VCO calibration, the receiving device 10a according to the present embodiment (not illustrated) sets to a dormant state the blocks that are not involved in the sub-band Sb search operation (local oscillator frequency search operation).

First, the host CPU 44 (see FIG. 2) judges whether or not the VCO calibration execution timing has arrived (step S21). The VCO calibration execution timing is set to a prescribed timing, such as when the tuner unit 4 starts up, or when the reception channel is changed. If it is judged that the VCO calibration execution timing has not arrived, the judgment in step S21 continues to be conducted. If it is judged that the VCO calibration execution timing has arrived, next, the host CPU 44 judges whether or not another tuner unit 4 is active (step S22). If another tuner unit 4 is not active, the process ends. If another tuner unit 4 is active, the host CPU 44 sets to a dormant state the blocks not involved in the local oscillator frequency search operation, namely, the variable frequency divider 425 (see FIG. 10), the I/Q mixers 412 and 413, and the baseband amps 417 and 418 (see FIG. 2 for both) (step S23).

As used herein, a dormant state refers to a state in which a small current is flowing through each of these blocks, enough to keep the block from turning off completely. A "small current" indicates a current of enough magnitude to leave some level of charge inside a capacitive element included in the semiconductor elements constituting these blocks, or in an equivalent parasitic capacitor. By leaving some level of charge in a capacitor of the semiconductor elements, the time taken when returning from the dormant state to the normal state may be shortened. Also, by leaving some level of charge in a capacitor of the semiconductor elements, the input impedance of the VCO 430 does not change even when returning back to the normal state. Consequently, it is possible to prevent the oscillator frequency of the VCO 430 from shifting away from the originally intended frequency due to a change of impedance.

Next, the host CPU 44 executes VCO calibration (step S24). In other words, a search for a sub-band Sb using the VCO 430 is started, and the VCO 430 is made to oscillate at a desired frequency. Subsequently, it is judged whether or not VCO calibration has ended (step S25), and if not ended, the judgment in step S25 continues to be conducted. In the case of judging that VCO calibration has ended, it is judged whether or not the PLL is locked at the sub-band Sb corresponding to the reception frequency (step S26), and if not locked, the judgment in step S26 continues to be conducted.

If the PLL is locked at the sub-band Sb corresponding to the reception frequency, operation is restarted for the variable frequency divider 425, the I/Q mixers 412 and 413, and the baseband amps 417 and 418 which were set to a dormant state in step S23 (step S27). As a result, a baseband signal, which is generated by the local oscillator 420a, divided by the variable frequency divider 425, mixed with an input RF signal by the I/Q mixers 412 and 413, and amplified by the baseband amps 417 and 418, is again output from the receiving device 10a.

Figure 11:
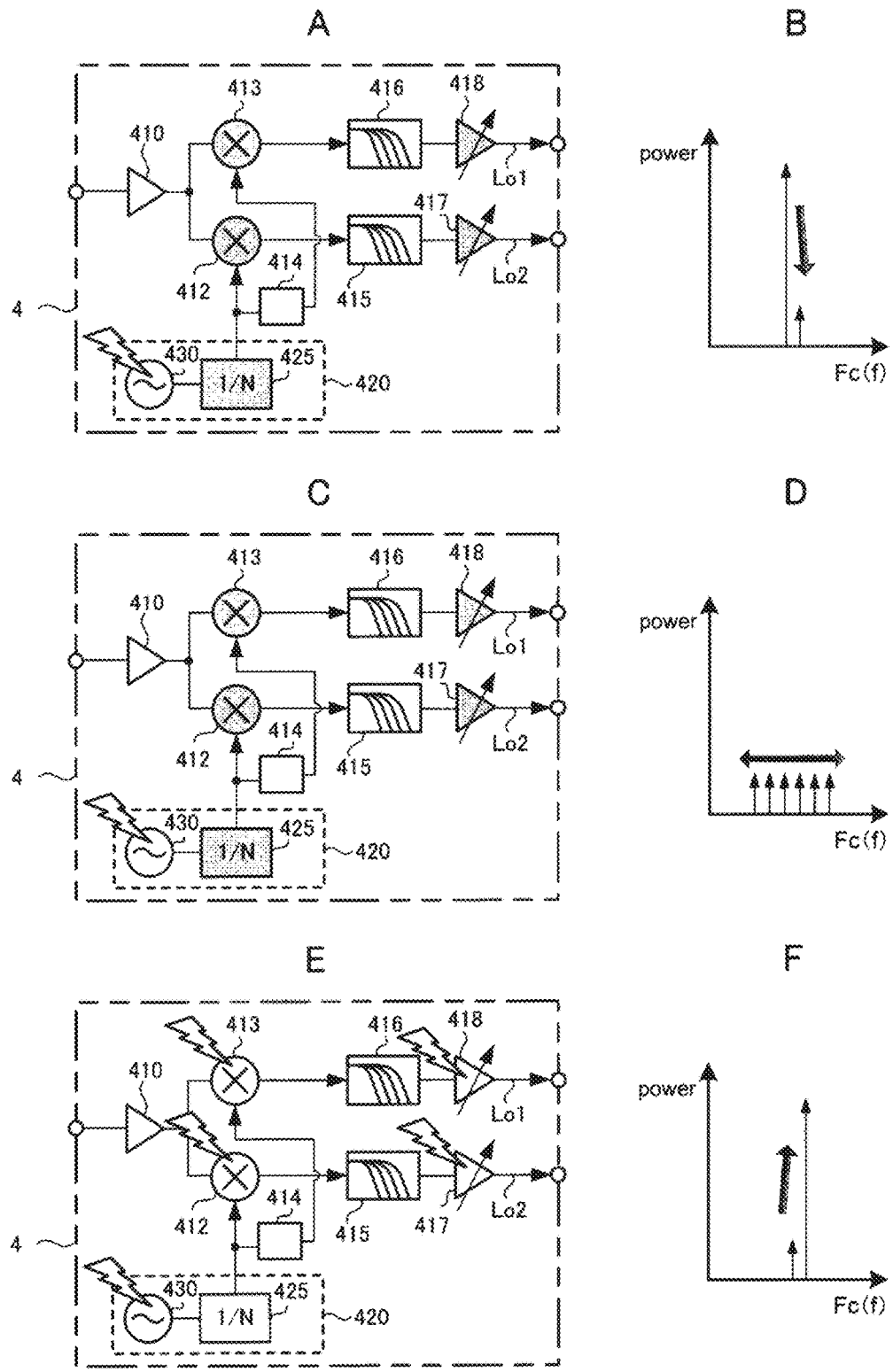
FIG. 11 is a diagram illustrating a receiving process according to a second embodiment of the present disclosure, and a comparison of radiation from a tuner unit.

FIG. 11 is a diagram illustrating an example of changes in signal radiation in the case of conducting the process illustrated in FIG. 10 in a receiving device according to the present embodiment. FIGS. 11A, 11C, and 11E are block diagrams illustrating exemplary configurations of the tuner unit 4, while FIGS. 11B, 11D, and 11F are graphs illustrating the frequency and signal level (power) of signals leaking out from the tuner unit 4.

FIG. 11A illustrates the state of setting to a dormant state the variable frequency divider 425, the I/Q mixers 412 and 413, and the baseband amps 417 and 418 as part of executing VCO calibration. In FIG. 11A, blocks set to a dormant state are shaded. By conducting such a process, signal radiation from the tuner unit 4 is limited to only that emitted from the local oscillator 420. Consequently, as illustrated in FIG. 11B, signal radiation from the tuner unit 4 is reduced compared to the radiation prior to dormancy.

FIG. 11C is an illustration, in block diagram form, of the state of the tuner unit 4 during the execution of VCO calibration. VCO calibration is conducted while keeping the variable frequency divider 425, the I/Q mixers 412 and 413, and the baseband amps 417 and 418 in a dormant state. FIG. 11D is a diagram illustrating signal radiation from the tuner unit 4 while VCO calibration is being executed. While VCO calibration is being executed, a sub-band Sb search is conducted as discussed earlier, and thus the range of radiated frequencies becomes a wide range. However, since the signal level is low, the amount of unwanted radiation to other tuner units 4 is kept low.

FIG. 11E is an illustration, in block diagram form, of the state of the tuner unit 4 after VCO calibration ends. After VCO calibration ends, operation is resumed for the variable frequency divider 425, the I/Q mixers 412 and 413, and the baseband amps 417 and 418. Consequently, as illustrated in FIG. 11F, signal radiation from the tuner unit 4 returns to that from before setting each block to a dormant state. In other words, the amount of unwanted radiation to other tuner units 4 also rises.

However, since the frequency of the signal radiated at this point is locked to a specific frequency (fixed frequency), no interference is exerted on another tuner unit 4 as long as the fixed frequency and the oscillator frequency Fc in the other tuner unit 4 do not enter into a specific frequency relationship. The conditions under which the fixed frequency and the oscillator frequency Fc in the other tuner unit 4 enter into a specific relationship may be investigated in advance, and by configuring each of the oscillator frequencies Fc to be offset from each other on the basis of the investigation results, mutual interference may be prevented.

According to the second embodiment of the present disclosure as discussed above, when executing VCO calibration, the variable frequency divider 425, the I/Q mixers 412 and 413, and the baseband amps 417 and 418 are set to a dormant state. Consequently, the signal radiation that may constitute unwanted radiation to another tuner unit 4 currently receiving a broadcast wave on another channel is limited to only that emitted from the local oscillator 420, and thus the absolute quantity of radiation in the air is also reduced. Also, by setting the I/Q mixers 412 and 413 as well as the baseband amps 417 and 418 to a dormant state, the RF signal input terminal of another receiving device 10 currently tuned to a broadcast wave on another channel and the RF signal input terminal of the current receiving device 10 enter a state of electrical isolation in practical terms. In other words, according to the present embodiment, the amount of noise caused by unwanted radiation and appearing in a picture currently being received by another tuner 4 may be reduced.

In addition, by setting the I/Q mixers 412 and 413 to a dormant state, frequencies resulting from the sum and difference of two different frequencies input into the I/Q mixers 412 and 413, or frequencies resulting from the sum and difference in the second-order and third-order harmonics of such frequencies (spurious emissions), may be reduced. Furthermore, by setting the baseband amps 417 and 418 to a dormant state, the amplification of spurious emissions produced by the I/Q mixers 412 and 413 may be prevented.

Figure 12:
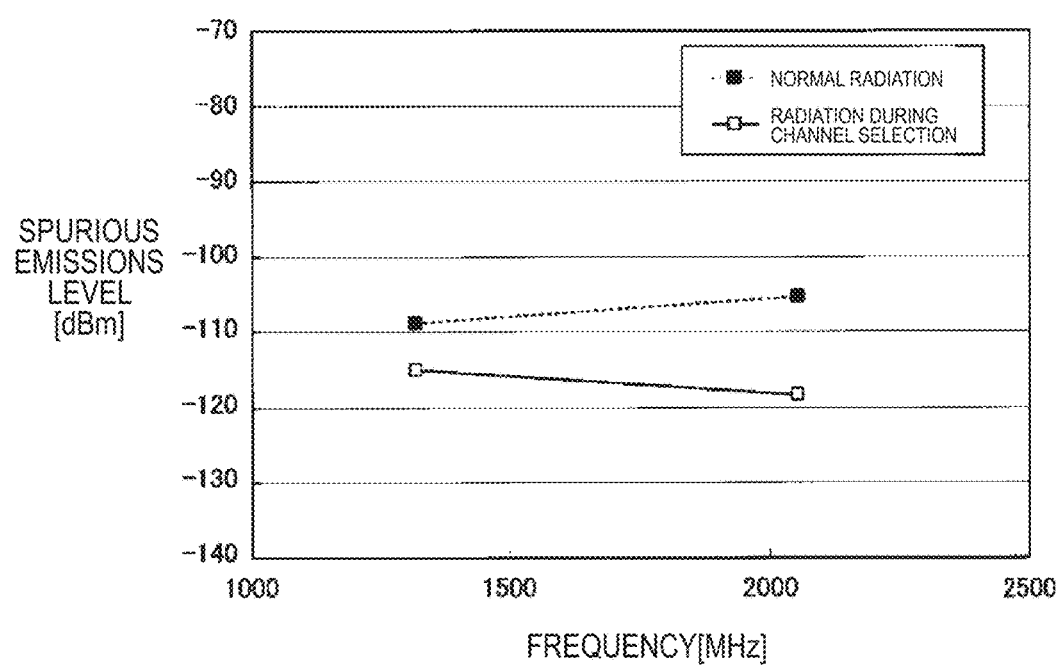
FIG. 12 is a graph illustrating a comparison of the spurious emissions level measured when blocks not involved in a local oscillator frequency search operation are set to a dormant state, and the spurious emissions level measured when not set to a dormant state.

FIG. 12 is a graph illustrated a comparison of the spurious emissions level measured when the blocks not involved in the local oscillator frequency search operation are set to a dormant state according to the present embodiment, and the spurious emissions level measured when not setting a dormant state as in the past. The vertical axis of the graph represents the spurious emissions level (units: dBm), while the horizontal axis represents frequency (units: MHz). The solid line indicates the spurious emissions level measured in the state of setting to a dormant state the blocks not involved in the local oscillator frequency search operation, while the dotted line indicates the spurious emissions level measured in the state of not conducting a dormancy process as in the past.

FIG. 12 demonstrates that in the measured range from approximately 1300 MHz to approximately 2100 MHz, the spurious emissions level indicated by the solid line in the case of conducting a process according to the present disclosure takes lower values compared to that of the past. In particular, near 2100 MHz, whereas the spurious emissions level measured in the state of not setting blocks to a dormant state as in the past is approximately −105 dBm, the spurious emissions level indicated by the solid line in the case of conducting a process according to the present disclosure takes a lower value of approximately −120 dBm. In other words, it becomes possible to decrease adverse effects imparted to other tuner units 4 to the extent that the spurious emissions level is lowered.

3. Various Modifications

Note that although the foregoing second embodiment gives an example of setting to a dormant state the variable frequency divider 425, the I/Q mixers 412 and 413, and the baseband amps 417 and 418 when executing VCO calibration, the configuration is not limited thereto. Blocks other than the above may also be set to a dormant state insofar as the blocks are other than the VCO 430. For example, in the case of providing a preamplifier upstream to the variable frequency divider 425 or inside the VCO 430, the preamplifier may also be set to a dormant state when executing VCO calibration. By conducting this process, it is possible to prevent a signal of large enough amplitude to cause signal distortion from being output from the preamplifier at an unchanged level.

In addition, although the foregoing embodiments give an example of a case in which the VCO 430 includes multiple sub-bands Sb, the configuration is not limited thereto. An embodiment is still applicable even in the case of configuring the tuning capacitor 31 of the resonator inside the VCO 430 with a single varicap diode, insofar as the configuration executes calibration (optimization) of the VCO 430.

In addition, although the foregoing embodiments give an example of a configuration in which the VCO 430 is built into an IC, the configuration is not limited thereto. An embodiment may also be applied to a configuration in which the tuning capacitor 31 of the VCO 430 is externally connected to the IC as in the past.

In addition, although the foregoing embodiments give an example of using a varicap diode to configure the tuning capacitor 31 that acts as a frequency selecting element, the configuration is not limited thereto. An embodiment may also be applied to a configuration using an element other than a varicap diode, insofar as the configuration uses a variable capacitance element.

In addition, although the foregoing embodiments give an example of carrying out VCO calibration every time a channel is selected, an embodiment is not limited thereto, and VCO calibration may also be executed only when the tuner unit 4 starts up, or at other timings.

In addition, although the foregoing embodiments give an example of conducting the search for a sub-band Sb in order from the sub-band Sb-1 with the lowest oscillator frequency Fc, the configuration is not limited thereto. For example, the search may be conducted in order from the sub-band Sb-m with the highest oscillator frequency Fc, or searches may be started at the same time from both ends of the sub-bands Sb and proceed towards the center.

In addition, although the foregoing embodiments give an example of conducting a process to speed up the internal clock or set to a dormant state the blocks other than the VCO 430 that constitute the tuner unit 4 when conducting VCO calibration, the configuration is not limited thereto. An embodiment may be applied not only to the case of conducting calibration, but also to the case of conducting a local oscillator frequency search for another purpose.

In addition, although the foregoing embodiments give an example in which the PLL loop is not operated during the search for a sub-band Sb and instead operated after a sub-band Sb is found, the configuration is not limited thereto. For example, an embodiment may also be applied to a process that raises or lowers the frequency one step at a time while locking the PLL.

In addition, although the foregoing embodiments give an example of the demodulator 41 conducting error correction using Reed-Solomon codes, the configuration is not limited thereto. Another means may also be used, insofar as the means is an error correction means having an error correction slot (time width).

Also, as discussed earlier, an embodiment is not limited to a configuration that takes the oscillator frequency of the VCO 430 to be double the reception frequency, and may also be applied to a configuration in which some other multiple is set, or a configuration that takes the same frequency as the reception frequency. In addition, as discussed earlier, an embodiment is not limited to a configuration that receives a broadcast wave from a satellite broadcast, and may also be applied to a configuration that receives a broadcast wave in another format, such as a digital terrestrial broadcast.

Additionally, the present technology may also be configured as below.

(1)

A receiving device including:

at least one distributor that distributes a high-frequency signal received by an antenna;

a high-frequency processing unit that outputs a received signal obtained by mixing the high-frequency signal distributed by the distributor with a local oscillator frequency generated by a local oscillator that includes a voltage-controlled oscillator; and a control unit that executes a local oscillator frequency search to investigate a correspondence between a control voltage applied to the voltage-controlled oscillator and the local oscillator frequency of the voltage-controlled oscillator, and when executing the local oscillator frequency search, sets to a dormant state parts constituting the local oscillator that are uninvolved in operation of the local oscillator frequency search.

(2)

The receiving device according to (1), wherein when the local oscillator frequency search ends, the control unit causes operation to be resumed for the parts set to the dormant state.

(3)

The receiving device according to (1) or (2), wherein the parts uninvolved in the operation of the local oscillator frequency search include a mixer that mixes the high-frequency signal distributed by the distributor with the local oscillator frequency generated by the local oscillator, and an amp that amplifies the high-frequency signal mixed by the mixer.

(4)

The receiving device according to any of (1) to (3), wherein when executing the local oscillator frequency search, the control unit sets the parts to the dormant state by causing a small current, enough to keep operation from stopping completely, to flow through the parts uninvolved in the operation of the local oscillator frequency search.

(5)

The receiving device according to any of (1) to (4), wherein the voltage-controlled oscillator includes an oscillator and a frequency selecting element, the frequency selecting element includes a plurality of tuning capacitors switched between an on state and an off state by switches, a voltage-controlled tuning capacitor, and a tuning inductor, and the plurality of tuning capacitors and the voltage-controlled tuning capacitor are interconnected in parallel, and when executing the local oscillator frequency search, the control unit changes an on/off state of the switches while locking a control voltage applied to the voltage-controlled tuning capacitor to a prescribed value, thereby switching a range of oscillator frequencies of the voltage-controlled oscillator covered by one connection state of the switches.

(6)

A receiving method including:

distributing a high-frequency signal received by an antenna;

outputting a received signal obtained by mixing the distributed high-frequency signal with a local oscillator frequency generated by a local oscillator that includes a voltage-controlled oscillator; and when executing a local oscillator frequency search to investigate a correspondence between a control voltage applied to the voltage-controlled oscillator and the local oscillator frequency of the voltage-controlled oscillator, setting to a dormant state parts constituting the local oscillator that are uninvolved in operation of the local oscillator frequency search.

REFERENCE SIGNS LIST 1 antenna
2 distributor
3 attenuator
3-1 attenuator
3-n attenuator
4 tuner unit
4-1 tuner unit
4-n tuner unit
10 receiving device
31 tuning capacitor
31-1 tuning capacitor
31-m tuning capacitor
32 switch
32-1 switch
32-m switch
33 voltage-controlled tuning capacitor
34 tuning inductor
40 high-frequency processing unit
41 demodulator
42 channel selector
43 storage unit 44 host CPU
45 control line
324 loop filter
410 LNA
411 pass-through circuit
411s switch
412 I/Q mixer
413 I/Q mixer
414 phase shifter
415 variable LPF
416 variable LPF
417, 418 baseband amp
420 local oscillator
421 crystal oscillator
422 frequency divider
423 phase comparator
424 loop filter
425 variable frequency divider
426 frequency divider
427 frequency counter
428 control logic
429 control voltage application unit
430 VCO
431 LC tuning circuit
432 oscillator
433 variable current source
440 frequency divider
441 arithmetic division circuit

The invention claimed is:

1. A receiving device comprising:
   at least one distributor that distributes a high-frequency signal received by an antenna;
   a high-frequency processing unit configured to output a received signal obtained by mixing the high-frequency signal distributed by the distributor with a local oscillator frequency generated by a local oscillator that includes a voltage-controlled oscillator; and
   a control unit including a processing unit configured to execute a local oscillator frequency calibration to investigate a correspondence between a control voltage applied to the voltage-controlled oscillator and the local oscillator frequency of the voltage-controlled oscillator, and when executing the local oscillator frequency calibration, to determine whether another tuner in the receiving device is active and, in response to determining that another tuner is active, to set to a dormant state parts of the local oscillator that are uninvolved in operation of the local oscillator frequency calibration and, otherwise, to end the local oscillator frequency calibration, wherein
   the parts set to the dormant state during the local oscillator frequency calibration include a mixer that mixes the high-frequency signal distributed by the distributor with the local oscillator frequency generated by the local oscillator, and an amp that amplifies the high-frequency signal mixed by the mixer.

2. The receiving device according to claim 1, wherein when the local oscillator frequency calibration ends, the control unit causes operation to be resumed for the parts set to the dormant state.

3. The receiving device according to claim 1, wherein when executing the local oscillator frequency calibration, the control unit sets the parts to the dormant state by causing a small current, enough to keep operation from stopping completely, to flow through the parts uninvolved in the operation of the local oscillator frequency calibration.

4. The receiving device according to claim 3, wherein the voltage-controlled oscillator includes an oscillator and a frequency selecting element, the frequency selecting element includes a plurality of tuning capacitors switched between an on state and an off state by switches, a voltage-controlled tuning capacitor, and a tuning inductor, and the plurality of tuning capacitors and the voltage-controlled tuning capacitor are interconnected in parallel, and
   when executing the local oscillator frequency calibration, the control unit changes an on/off state of the switches while locking a control voltage applied to the voltage-controlled tuning capacitor to a prescribed value, thereby switching a range of oscillator frequencies of the voltage-controlled oscillator covered by one connection state of the switches.

5. A receiving method performed by a receiving device comprising:
   distributing a high-frequency signal received by an antenna;
   outputting a received signal obtained by mixing the distributed high-frequency signal with a local oscillator frequency generated by a local oscillator that includes a voltage-controlled oscillator; and
   when executing a local oscillator frequency calibration to investigate a correspondence between a control voltage applied to the voltage-controlled oscillator and the local oscillator frequency of the voltage-controlled oscillator, determining whether another tuner in the receiving device is active and, in response to determining that another tuner is active, setting to a dormant state parts of the local oscillator that are uninvolved in operation of the local oscillator frequency calibration and, otherwise, ending the local oscillator frequency calibration, wherein
   the parts set to the dormant state during the local oscillator frequency calibration include a mixer that mixes the distributed high-frequency signal with the local oscillator frequency generated by the local oscillator, and an amp that amplifies the high-frequency signal mixed by the mixer.

* * * * *